(12) United States Patent
Xia et al.

(10) Patent No.: US 11,374,072 B2
(45) Date of Patent: Jun. 28, 2022

(54) DISPLAY PANEL WITH QUANTOM DOT AND MANUFACTURING METHOD THEREOF

(71) Applicant: Wuhan China Star Optoelectronics Semiconductor Display Technology Co., Ltd., Wuhan (CN)

(72) Inventors: Cunjun Xia, Wuhan (CN); Munjae Lee, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 190 days.

(21) Appl. No.: 16/897,312

(22) Filed: Jun. 10, 2020

(65) Prior Publication Data

US 2021/0175301 A1    Jun. 10, 2021

(30) Foreign Application Priority Data

Dec. 5, 2019   (CN) .......................... 201911236089.0

(51) Int. Cl.
*H01L 27/32* (2006.01)
*H01L 51/50* (2006.01)
*H01L 51/56* (2006.01)

(52) U.S. Cl.
CPC ........ *H01L 27/3246* (2013.01); *H01L 27/322* (2013.01); *H01L 51/502* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2018/0374904 A1 | 12/2018 | Chao | |
| 2019/0206960 A1* | 7/2019 | Lee | H01L 27/3246 |
| 2020/0381484 A1* | 12/2020 | Choe | H01L 51/5253 |
| 2021/0126055 A1* | 4/2021 | Lee | H01L 27/3244 |

FOREIGN PATENT DOCUMENTS

| | | |
|---|---|---|
| CN | 105097878 A | 11/2015 |
| CN | 105914228 A | 8/2016 |
| CN | 107731883 A | 2/2018 |
| CN | 109786431 A | 5/2019 |

* cited by examiner

*Primary Examiner* — J. E. Schoenholtz
(74) *Attorney, Agent, or Firm* — Nathan & Associates; Menachem Nathan

(57) ABSTRACT

The present disclosure provides a display panel and a manufacturing method thereof. The display panel includes an array substrate, a light-emitting layer, a first barrier layer, a color film layer, a planarization layer, and a second barrier layer. The array substrate includes a pixel definition layer, the pixel definition layer includes pixel definition regions and a retaining wall disposed between the pixel definition regions, the light-emitting layer is disposed in pixel definition regions, the first barrier layer covers the array substrate, the pixel definition layer, and the light-emitting layer, the first barrier layer includes grooves, the color film layer is disposed in the grooves, the planarization layer covers the first barrier layer and the color film layer, and the second barrier layer is disposed on the planarization layer. In the present disclosure, the first barrier layer is disposed on the light-emitting layer to improve performance of the display panel.

2 Claims, 4 Drawing Sheets

DISPLAY PANEL WITH QUANTUM DOT AND MANUFACTURING METHOD THEREOF

FIELD OF INVENTION

The present disclosure relates to the display panel field, and more particularly, to a display panel and a manufacturing method thereof.

BACKGROUND OF INVENTION

At present, in the preparation of display panels, during a manufacturing process of light-emitting layers of the display panels, it needs a multi-channel precision mask process and an inductive coupling device high-precision alignment process, which makes process complicated, low yield, and high preparation cost, moreover, a polarizer needs to be attached, which causes light damage, thereby affecting performance of the display panels and increasing preparation cost.

SUMMARY OF INVENTION

The present disclosure provides a display panel and a manufacturing method thereof to improve performance of the display panels and preparation efficiency of the display panels and reduce production cost.

The present disclosure provides a display panel, comprising an array substrate comprising a pixel definition layer, wherein the pixel definition layer comprises a plurality of pixel definition regions and a retaining wall disposed between the pixel definition regions, and the pixel definition regions comprise a plurality of red sub-regions, a plurality of blue sub-regions, and a plurality of green sub-regions; a light-emitting layer disposed in the plurality of pixel definition regions and comprising a plurality of light-emitting portions, wherein each of the light-emitting portions is disposed on one of the pixel definition regions, and each of the light-emitting portions comprises a first electrode, a light-emitting unit, and a second electrode, which are disposed in a stack; a first barrier layer covering the array substrate and the light-emitting layer and comprising a plurality of grooves, wherein each of the grooves is located on one of the pixel definition regions; a color film layer disposed in the grooves and comprising a plurality of red color film portions, a plurality of green color film portions, and a plurality of blue color film portions, wherein one of the red color film portions, one of the green color film portions, and one of the blue color film portions are correspondingly disposed on each of the light-emitting portions; a planarization layer covering the first barrier layer and the color film layer; and a second barrier layer disposed on the planarization layer.

In the display panel provided by the present disclosure, the light-emitting unit emits a blue light, the red color film portions comprise red quantum dots, the red quantum dots are excited by the blue light to produce a red light, the green color film portions comprise green quantum dots, the green quantum dot are excited by the blue light to produce a green light.

In the display panel provided by the present disclosure, the red quantum dots are uniformly distributed in the red color film portions, and the green quantum dots are uniformly distributed in the green color film portions.

In the display panel provided by the present disclosure, the red quantum dots are located at a bottom of the red color film portions, and the green quantum dots are located at a bottom of the green color film portions.

In the display panel provided by the present disclosure, a distance from an upper surface of the first barrier layer on the retaining wall to a lower surface of the retaining wall is same as a thickness of the light-emitting layer, the color film layer, and the first barrier layer filled on the pixel definition regions.

The present disclosure provides a manufacturing method of a display panel, comprising providing an array substrate, wherein the array substrate comprises a pixel definition layer, the pixel definition layer comprises a plurality of pixel definition regions and a retaining wall disposed between the pixel definition regions, and the pixel definition regions comprise a plurality of red sub-regions, a plurality of blue sub-regions, and a plurality of green sub-regions; disposing a light-emitting layer in the plurality of pixel definition regions of the array substrate, wherein the light-emitting layer comprises a plurality of light-emitting portions, each of the light-emitting portions is disposed on one of the pixel definition regions, and each of the light-emitting portions comprises a first electrode, a light-emitting unit, and a second electrode, which are disposed in a stack; covering a first barrier layer on the light-emitting layer, the retaining wall, and the array substrate, wherein the first barrier layer comprises a plurality of grooves, and each of the grooves is located on one of the pixel definition regions; disposing a color film layer in the grooves, wherein the color film layer comprises a plurality of red color film portions, a plurality of green color film portions, and a plurality of blue color film portions, and one of the red color film portions, one of the green color film portions, and one of the blue color film portions are correspondingly disposed on each of the light-emitting portions; covering a planarization layer on the first barrier layer and the color film layer; and covering a second barrier layer on the planarization layer.

In the manufacturing method of the display panel provided by the present disclosure, the light-emitting unit emits a blue light, the red color film portions comprise red quantum dots, the red quantum dots are excited by the blue light to produce a red light, the green color film portions comprise green quantum dots, the green quantum dot are excited by the blue light to produce a green light.

In the manufacturing method of the display panel provided by the present disclosure, the red quantum dots are uniformly distributed in the red color film portions, and the green quantum dots are uniformly distributed in the green color film portions.

In the manufacturing method of the display panel provided by the present disclosure, the red quantum dots are located at a bottom of the red color film portions, and the green quantum dots are located at a bottom of the green color film portions.

In the manufacturing method of the display panel provided by the present disclosure, a distance from an upper surface of the first barrier layer on the retaining wall to a lower surface of the retaining wall is same as a thickness of the light-emitting layer, the color film layer, and the first barrier layer filled on the pixel definition regions.

The present disclosure provides a display panel and a manufacturing method thereof. The display panel comprises an array substrate, a light-emitting layer, a first barrier layer, a color film layer, a planarization layer, and a second barrier layer. The array substrate comprises a pixel definition layer, the pixel definition layer comprises a plurality of pixel definition regions and a retaining wall disposed between the pixel definition regions, the light-emitting layer is disposed in the plurality of pixel definition regions, the first barrier layer covers the array substrate, the pixel definition layer, and the light-emitting layer, the first barrier layer comprises a plurality of grooves, the color film layer is disposed in the grooves, the color film layer comprises light-emitting quantum dots, the planarization layer covers the first barrier layer and the color film layer, and the second barrier layer is disposed on the planarization layer. In the present disclosure, the first barrier layer and the color film layer comprising light-emitting quantum dots are sequentially disposed on the light-emitting layer, so that the display panel may be manufactured without precise mask technology to achieve full-color display, which reduces production cost and improves display of resolution. In the present disclosure, there is no need to use a polarizer to eliminate external interference display, which reduces a thickness of a display screen of the display panels, and because a transmitted light is used, service life of the display panels is improved. In the present disclosure, because the first barrier layer and the color film layer containing light-emitting quantum dots are sequentially arranged on the light-emitting layer, a distance of blue light-emitting diodes from the color film layer containing light-emitting quantum dots is close, which improves viewing angles of light-emitting diodes, thereby improving performance of the display panels and reducing production cost.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

The technical solutions in the embodiments of the present disclosure will be clearly and completely described below in conjunction with the accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

Figure 1:
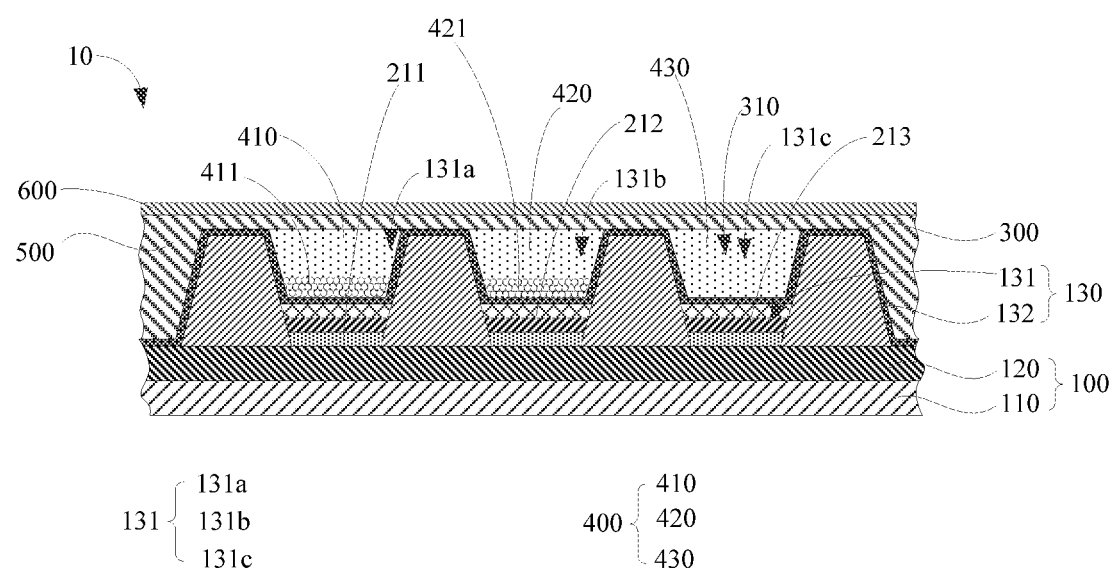
FIG. 1 is a schematic sectional diagram of a display panel provided by the present disclosure.

Refer to FIG. 1, FIG. 1 is a schematic sectional diagram of a display panel provided by the present disclosure. The display panel 10 comprises an array substrate 100, a light-emitting layer 200, a first barrier layer 300, a color film layer 400, a planarization layer 500, and a second barrier layer 600.

The array substrate 100 comprises a thin film transistor layer 120 and a glass substrate 110. The thin film transistor layer 120 is disposed on the glass substrate 110. A pixel definition layer 130 is disposed on the thin film transistor layer 120. The pixel definition layer 130 comprises a plurality of pixel definition regions 131 and a retaining wall 132 disposed between the pixel definition regions 131. The pixel definition regions 131 comprise a plurality of red sub-regions 131$a$, a plurality of blue sub-regions 131$c$, and a plurality of green sub-regions 131$b$.

The light-emitting layer 200 is disposed in the plurality of pixel definition regions 131. The light-emitting layer 200 comprises a plurality of light-emitting portions 210. Each of the light-emitting portions 210 is disposed on one of the pixel definition regions 131. Each of the light-emitting portions 210 comprises a first electrode 211, a light-emitting unit 212, and a second electrode 213, which are disposed in a stack. The first electrode 213 is an anode or a cathode. The first electrode 211 and the second electrode 212 have different polarities.

The first barrier layer 300 covers the array substrate 100 and the light-emitting layer 200. The first barrier layer 300 comprises a plurality of grooves 310. Each of the grooves 310 is located on one of the pixel definition regions 131. The first barrier layer 300 achieves a function as a barrier against water and oxygen.

Figure 4:
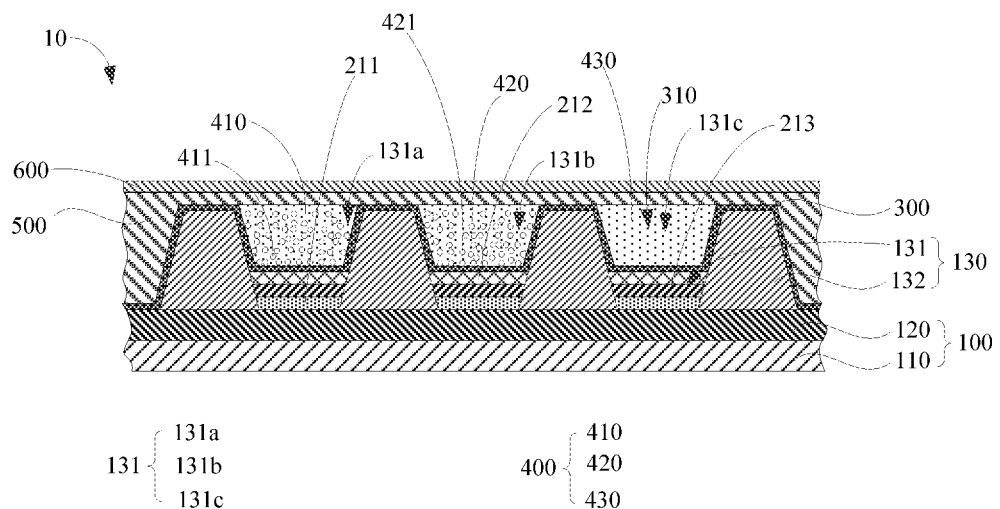
FIG. 4 is a schematic sectional diagram of uniformly distributed quantum dots in the display panel provided by the present disclosure.

Refer to FIG. 4, FIG. 4 is a schematic sectional diagram of uniformly distributed quantum dots in the display panel provided by the present disclosure. The color film layer 400 is disposed in the grooves 310. The color film layer 400 comprises a plurality of red color film portions 410, a plurality of green color film portions 420, and a plurality of blue color film portions 430. One of the red color film portions 410, one of the green color film portions 420, and one of the blue color film portions 430 are correspondingly disposed on each of the light-emitting portions 210. The red color film portions 410 comprise red quantum dots 411. The red quantum dots 411 are distributed in the red color film portions 410. The red quantum dots 411 are located at a bottom of the red color film portions 410. The red quantum dots 411 are excited by a blue light to produce a red light. The green color film portions 420 comprise green quantum dots 421. The green quantum dots 421 are distributed in the green color film portions 420. The green quantum dots 421 are located at a bottom of the green color film portions 420. The green quantum dots 421 are excited by the blue light to produce a green light. A distance from an upper surface of the first barrier layer 300 on the retaining wall 132 to a lower surface of the retaining wall 132 is same as a thickness of the light-emitting layer 200, the color film layer 400, and the first barrier layer 300 filled on the pixel definition regions 131.

The planarization layer 500 covers the first barrier layer 300 and the color film layer 400. The planarization layer 500 is used for releasing stress of an inorganic film layer and covering particles on the first barrier layer 300 and the color film layer 400.

The second barrier layer 600 is disposed on the planarization layer 500. The second barrier layer 600 achieves the function as a barrier against water and oxygen.

Figure 2:
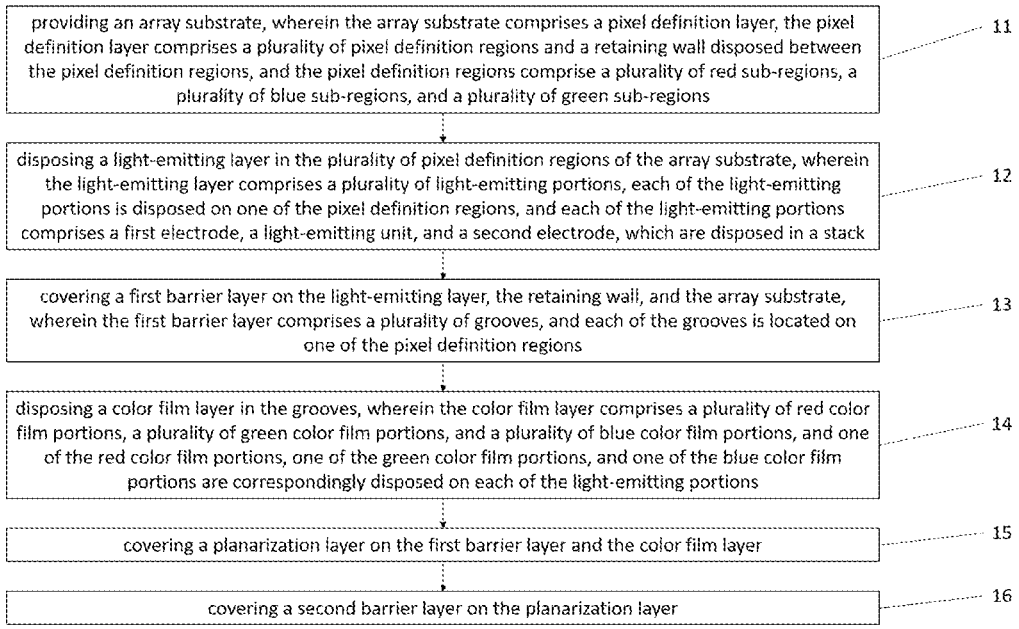
FIG. 2 is a flowchart of a manufacturing method of the display panel provided by the present disclosure.
Figure 3:
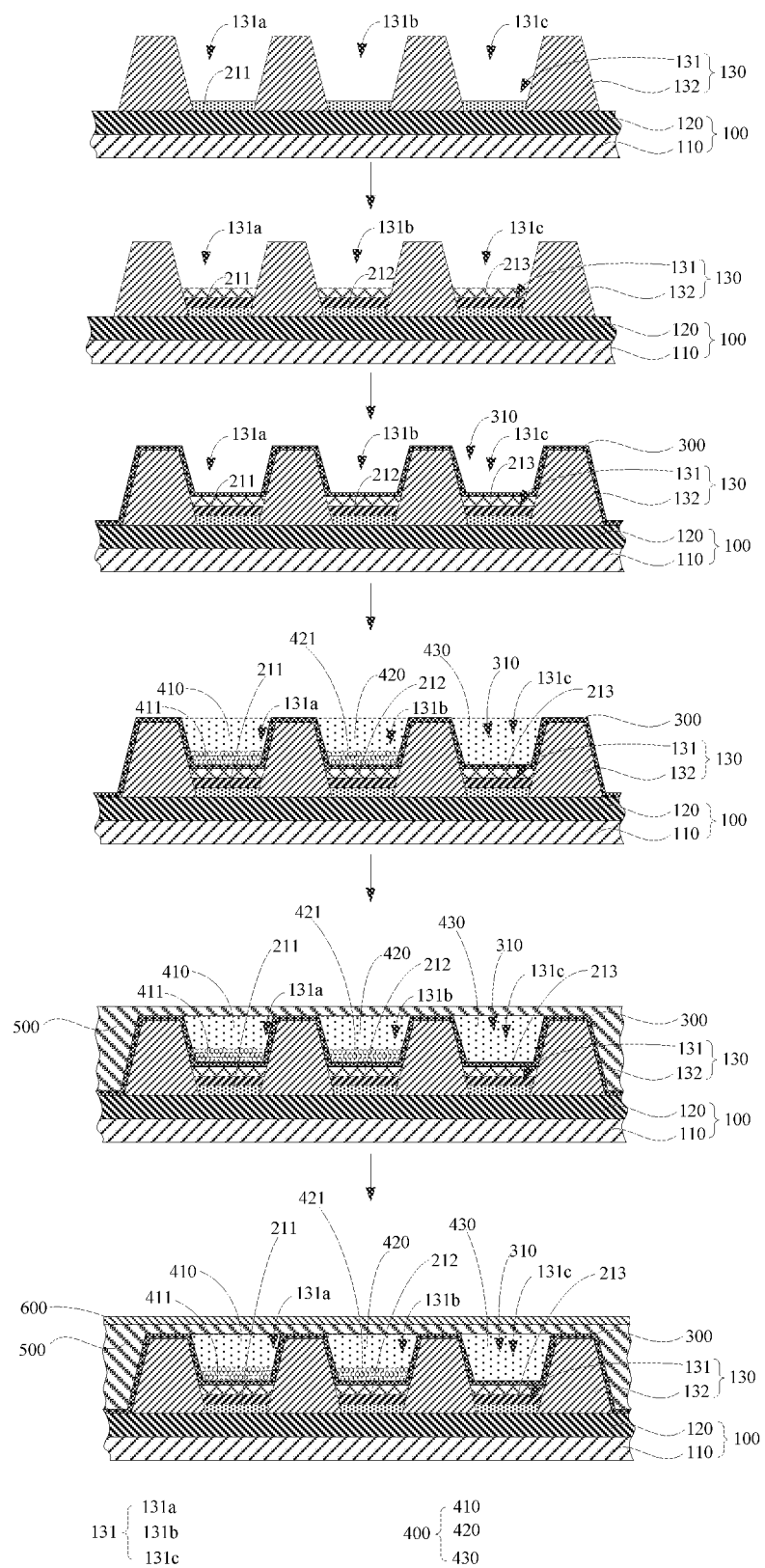
FIG. 3 is a flowchart of a sectional diagram of the manufacturing method of the display panel provided by the present disclosure.

Refer to FIG. 2 and FIG. 3, FIG. 2 is a flowchart of a manufacturing method of the display panel provided by the present disclosure, and FIG. 3 is a flowchart of a sectional diagram of the manufacturing method of the display panel provided by the present disclosure. The present disclosure further provides a manufacturing method of the display panel, and the method comprises:

Step 11: providing an array substrate 100. The array substrate 100 comprises a pixel definition layer 130, the pixel definition layer 130 comprises a plurality of pixel definition regions 131 and a retaining wall 132 disposed between the pixel definition regions 131. The pixel definition regions 131 comprise a plurality of red sub-regions 131a, a plurality of blue sub-regions 131c, and a plurality of green sub-regions 131b.

The array substrate 100 comprises a thin film transistor layer 120 and a glass substrate 110. The thin film transistor layer 120 is disposed on the glass substrate 110. A pixel definition layer 130 is deposited on the thin film transistor layer 120. The pixel definition layer 130 comprises the plurality of pixel definition regions 131 and the retaining wall 132 disposed between the pixel definition regions 131. The pixel definition regions 131 comprise the plurality of red sub-regions 131a, the plurality of blue sub-regions 131c, and the plurality of green sub-regions 131b.

Step 12: disposing a light-emitting layer 200 in the plurality of pixel definition regions 131 of the array substrate 100. The light-emitting layer 200 comprises a plurality of light-emitting portions 210, each of the light-emitting portions 210 is disposed on one of the pixel definition regions 131, and each of the light-emitting portions 210 comprises a first electrode 211, a light-emitting unit 212, and a second electrode 213, which are disposed in a stack.

A light-emitting layer material is deposited in the pixel definition regions 131 of the array substrate 100 by adopting a thermal evaporation process to form the light-emitting layer 200. The light-emitting layer 200 comprises the plurality of light-emitting portions 210. Each of the light-emitting portions 210 is disposed on one of the pixel definition regions 131. Each of the light-emitting portions 210 comprises the first electrode 211, the light-emitting unit 212, and the second electrode 213, which are disposed in a stack. The first electrode 213 is an anode or a cathode. The first electrode 211 and the second electrode 212 have different polarities.

Step 13: covering a first barrier layer 300 on the light-emitting layer 200, the retaining wall 132, and the array substrate 100. The first barrier layer 300 comprises a plurality of grooves 310, and each of the grooves 310 is located on one of the pixel definition regions 131.

The first barrier layer 300 is formed on the light-emitting layer 200, the retaining wall 132, and the array substrate 100 by adopting a chemical vapor deposition process or an atomic layer deposition process. The first barrier layer 300 comprises the plurality of grooves 310. Each of the grooves 310 is located on one of the pixel definition regions 131. The first barrier layer 300 achieves a function as a barrier against water and oxygen.

Step 14: disposing a color film layer 400 in the grooves 310. The color film layer 400 comprises a plurality of red color film portions 410, a plurality of green color film portions 420, and a plurality of blue color film portions 430, and one of the red color film portions 410, one of the green color film portions 420, and one of the blue color film portions 430 are correspondingly disposed on each of the light-emitting portions 210.

The color film layer 400 is formed in the grooves 310 by adopting an inkjet printing technology process or a coating technology process. The color film layer 400 comprises the plurality of red color film portions 410, the plurality of green color film portions 420, and the plurality of blue color film portions 430. One of the red color film portions 410, one of the green color film portions 420, and one of the blue color film portions 430 are correspondingly disposed on each of the light-emitting portions 210. The red color film portions 410 comprise red quantum dots 411. The red quantum dots 411 are distributed in the red color film portions 410. The red quantum dots 411 are located at a bottom of the red color film portions 410. The red quantum dots 411 are excited by a blue light to produce a red light. The green color film portions 420 comprise green quantum dots 421. The green quantum dots 421 are distributed in the green color film portions 420. The green quantum dots 421 are located at a bottom of the green color film portions 420. The green quantum dots 421 are excited by the blue light to produce a green light. A distance from an upper surface of the first barrier layer 300 on the retaining wall 132 to a lower surface of the retaining wall 132 is same as a thickness of the light-emitting layer 200, the color film layer 400, and the first barrier layer 300 filled on the pixel definition regions 131.

Step 15: covering a planarization layer 500 on the first barrier layer 300 and the color film layer 400.

The planarization layer 500 is formed on the first barrier layer 300 and the color film layer 400 by adopting an inkjet printing technology process or a coating technology process. The planarization layer 500 is used for releasing stress of an inorganic film layer and covering particles on the first barrier layer 300 and the color film layer 400.

Step 16: covering a second barrier layer 600 on the planarization layer 500.

The second barrier layer 600 is formed on the planarization layer 500 by adopting a chemical vapor deposition process or an atomic layer deposition process. The second barrier layer 600 achieves the function as a barrier against water and oxygen.

The present disclosure provides a display panel and a manufacturing method thereof. The display panel comprises an array substrate, a light-emitting layer, a first barrier layer, a color film layer, a planarization layer, and a second barrier layer. The array substrate comprises a pixel definition layer, the pixel definition layer comprises a plurality of pixel definition regions and a retaining wall disposed between the pixel definition regions, the light-emitting layer is disposed in the plurality of pixel definition regions, the first barrier layer covers the array substrate, the pixel definition layer, and the light-emitting layer, the first barrier layer comprises a plurality of grooves, the color film layer is disposed in the grooves, the color film layer comprises light-emitting quantum dots, the planarization layer covers the first barrier layer and the color film layer, and the second barrier layer is disposed on the planarization layer. In the present disclosure, the first barrier layer and the color film layer comprising light-emitting quantum dots are sequentially disposed on the light-emitting layer, so that the display panel may be manufactured without precise mask technology to achieve full-color display, which reduces production cost and improves display of resolution. In the present disclosure, there is no need to use a polarizer to eliminate external interference display, which reduces a thickness of a display screen of the display panels, and because a transmitted light is used, service life of the display panels is improved. In the present disclosure, because the first barrier layer and the color film layer containing light-emitting quantum dots are sequentially arranged on the light-emitting layer, a distance of blue light-emitting diodes from the color film layer containing light-emitting quantum dots is close, which improves viewing angles of light-emitting diodes, thereby improving performance of the display panels and reducing production cost.

The embodiments of the present disclosure have been described in detail above. The present disclosure uses specific examples to describe principles and embodiments of the present disclosure. The descriptions of the above embodiments are only used to help understand technical solutions of the present disclosure and core ideas thereof. For those skilled in the art, according to the idea of the present disclosure, there will be changes in the specific embodiments and application scope. In summary, the contents of the description should not be construed as a limitation on the present disclosure.

What is claimed is:

1. A display panel, comprising:
   an array substrate comprising a pixel definition layer, wherein the pixel definition layer comprises a plurality of pixel definition regions and a retaining wall disposed between the pixel definition regions, and the pixel definition regions comprise a plurality of red sub-regions, a plurality of blue sub-regions, and a plurality of green sub-regions;
   a light-emitting layer disposed in the plurality of pixel definition regions and comprising a plurality of light-emitting portions, wherein each of the light-emitting portions is disposed on one of the pixel definition regions, and each of the light-emitting portions comprises a first electrode, a light-emitting unit, and a second electrode, which are disposed in a stack;
   a first barrier layer covering the array substrate and the light-emitting layer and comprising a plurality of grooves, wherein each of the grooves is located on one of the pixel definition regions;
   a color film layer disposed in the grooves and comprising a plurality of red color film portions, a plurality of green color film portions, and a plurality of blue color film portions, wherein one of the red color film portions, one of the green color film portions, and one of the blue color film portions are correspondingly disposed on each of the light-emitting portions;
   a planarization layer covering the first barrier layer and the color film layer;
   a second barrier layer disposed on the planarization layer, and
   wherein the light-emitting unit emits a blue light, the red color film portions comprise red quantum dots, the red quantum dots are excited by the blue light to produce a red light, the green color film portions comprise green quantum dots, the green quantum dot are excited by the blue light to produce a green light, the red quantum dots are located only at a bottom of the red color film portions, and the green quantum dots are located only at a bottom of the green color film portions.

2. A manufacturing method of a display panel, comprising:
   providing an array substrate, wherein the array substrate comprises a pixel definition layer, the pixel definition layer comprises a plurality of pixel definition regions and a retaining wall disposed between the pixel definition regions, and the pixel definition regions comprise a plurality of red sub-regions, a plurality of blue sub-regions, and a plurality of green sub-regions;
   disposing a light-emitting layer in the plurality of pixel definition regions of the array substrate, wherein the light-emitting layer comprises a plurality of light-emitting portions, each of the light-emitting portions is disposed on one of the pixel definition regions, and each of the light-emitting portions comprises a first electrode, a light-emitting unit, and a second electrode, which are disposed in a stack;
   covering a first barrier layer on the light-emitting layer, the retaining wall, and the array substrate, wherein the first barrier layer comprises a plurality of grooves, and each of the grooves is located on one of the pixel definition regions;
   disposing a color film layer in the grooves, wherein the color film layer comprises a plurality of red color film portions, a plurality of green color film portions, and a plurality of blue color film portions, and one of the red color film portions, one of the green color film portions, and one of the blue color film portions are correspondingly disposed on each of the light-emitting portions;
   covering a planarization layer on the first barrier layer and the color film layer;
   covering a second barrier layer on the planarization layer, and
   wherein the light-emitting unit emits a blue light, the red color film portions comprise red quantum dots, the red quantum dots are excited by the blue light to produce a red light, the green color film portions comprise green quantum dots, the green quantum dot are excited by the blue light to produce a green light, the red quantum dots are located only at a bottom of the red color film portions, and the green quantum dots are located only at a bottom of the green color film portions.

* * * * *